United States Patent [19]
Karraker

[11] Patent Number: 5,623,219
[45] Date of Patent: Apr. 22, 1997

[54] MAXIMAL VOLTAGE THREE-PHASE PWM WITHOUT THIRD HARMONIC INJECTION

[76] Inventor: Douglas W. Karraker, S. 67 W. 14570 Gaulke Ct., Muskego, Wis. 53150

[21] Appl. No.: 551,779

[22] Filed: Nov. 7, 1995

[51] Int. Cl.[6] .................................................. H03D 1/00
[52] U.S. Cl. ............................ 327/50; 327/71; 327/355
[58] Field of Search .............................. 318/599; 327/50, 327/71, 317, 318, 355, 361

[56] References Cited

U.S. PATENT DOCUMENTS

4,341,961  7/1982  Komoriya ........................ 307/355

Primary Examiner—Timothy P. Callahan
Assistant Examiner—Jeffrey Zweizig
Attorney, Agent, or Firm—Waddey & Patterson; Mark J. Patterson

[57] ABSTRACT

An inverter control circuit includes means for continuously computing and subtracting an average voltage from each of three modulating input waveforms. The average voltage is computed by determining the instantaneous maximum and minimum voltages of the three waveforms, summing these voltages, and then dividing them by an averaging factor. The shifted modulating waveforms are then compared with a high-frequency carrier wave to modulate the duty cycles of the inverter outputs to approximate desired output waveform characteristics.

6 Claims, 7 Drawing Sheets

Adjustment for maximal voltage output

Three Phase Inverter

FIG. 1 (PRIOR ART)

Sine Coded PWM with 3rd Harmonic Injection

FIG. 4 (PRIOR ART)

PWM Phase Voltages, $V_a^{mod}=0.5$, $V_b^{mod}=0$, $V_c^{mod}=-0.5$

*FIG. 5 (PRIOR ART)*

PWM Phase Voltages, $V_a^{mod'} = 1.2,\quad V_b^{mod'} = -0.6,\quad V_c^{mod'} = -0.6$ $V_a^{mod} = 0.9,\quad V_b^{mod} = -0.9,\quad V_c^{mod} = -0.9$

Adjustment for maximal voltage output

MAXIMAL VOLTAGE THREE-PHASE PWM WITHOUT THIRD HARMONIC INJECTION

BACKGROUND OF THE INVENTION

1. Technical Field

The present invention relates generally to the field of inverter circuits, and in particular to inverter circuits using pulse width modulation techniques (PWM) to approximate desired output waveform characteristics.

2. Background Art

In a prior-art technique known as "sine-coded PWM," a control circuit causes the three outputs of a three-phase inverter to approximate the voltages of three corresponding modulating sinusoidal waveform inputs by adjusting the respective duty cycles of each of the three outputs. The control circuit accomplishes this by comparing each input waveform with a high-frequency triangular carrier waveform. Switching means corresponding to each inverter output are switched on or off depending upon whether the corresponding modulating waveform input is above or below the carrier waveform. The basic sine-coded PWM technique reaches a limit as the amplitude of a modulating waveform approaches that of the carrier wave. When the amplitude of the modulating waveform exceeds that of the carrier wave, an undesirable phenomenon known as "pulse-dropping" occurs.

In one prior-art solution to the problem of pulse-dropping, a third harmonic waveform is injected into the modulating sine waveform. The injection of the third harmonic allows the fundamental component of the modulating waveform to be higher before pulse dropping occurs. This approach is disadvantageous, however, because of the greater complexity of the modulating waveform.

SUMMARY OF THE INVENTION

The present invention provides means for maximizing the line-to-line voltages of the outputs of the pulse width modulation means, while avoiding the disadvantages of the prior art. In a preferred embodiment of the present invention, the inverter control circuit includes means for continuously computing and subtracting an average voltage from each of the three modulating waveforms. The average voltage is computed by determining the instantaneous maximum and minimum voltages of the three waveforms, summing these voltages, and then dividing them by an averaging factor. The shifted modulating waveforms are then compared with a high-frequency carrier wave to modulate the duty cycles of the inverter outputs to approximate the desired waveform characteristics.

DESCRIPTION OF SPECIFIC EMBODIMENTS

Figure 1:
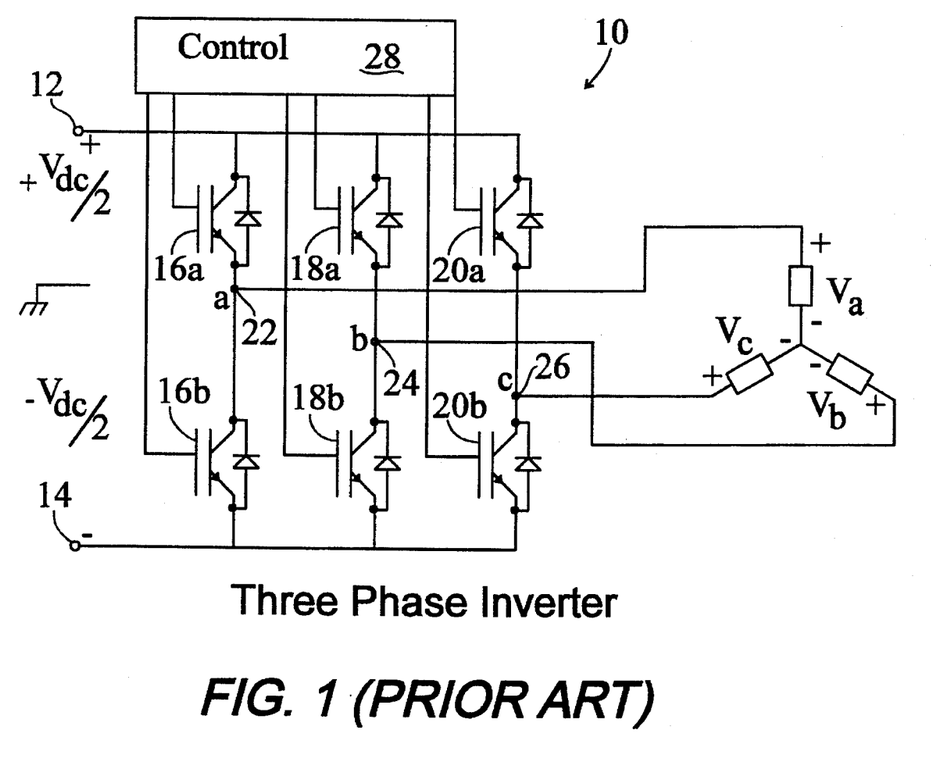
FIG. 1 is a circuit diagram of a three-phase inverter circuit according to the prior art.

FIG. 1 is a schematic diagram of a three-phase inverter 10 circuit according to the prior art. The inverter has positive and negative terminals 12, 14 for connection to a DC source, which supplies $+v_{dc}/2$ and $-v_{dc}/2$, or $+v_{dc}$ altogether. Three pairs of transistors 16a–b, 18a–b, 20a–b are connected across the positive and negative terminals, and each pair of transistors has an output terminal 22, 24, 26 between them. A control circuit 28 switches the six transistors on and off according to a desired pattern.

Ideally, the output of each transistor pair approximates a three-phase sinusoidal voltage source. The ideal waveforms that the inverter should approximate can be described by the following formulae:

$$v_a = v_p \sin(2Yft)$$

$$v_b = v_p \sin(2\pi ft - 120°)$$

$$v_c = v_p \sin(2\pi ft + 120°)$$

where "f" is defined as the fundamental frequency, where $v_p$ is the desired peak voltage, and where $v_a$, $v_b$, and $v_c$ represent the desired three-phase outputs at terminals 22, 24, and 26.

The inverter control circuit 28 approximates sine waves at outputs 22, 24, and 26 through the use of pulse width modulation. The control circuit 28 alternately switches between the upper and lower transistors in each of transistor pairs 16a–b, 18a–b, and 20a–b, such that the average voltage over a short time period at outputs 22, 24, and 26 changes in a sinusoidal fashion.

Figure 2A:
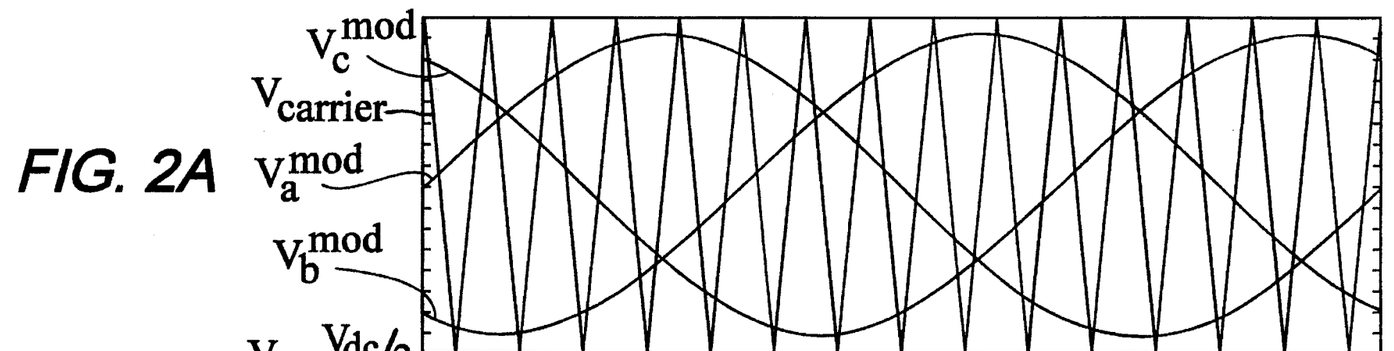
FIGS. 2A–C are, respectively, graphs of three-phase modulating waveforms superimposed on a triangular carrier waveform; output voltages of a pulse width modulation circuit receiving the modulating waveforms as an input; and line-to-line output voltages of the pulse with modulation circuit, according to the prior art.
Figure 2B:
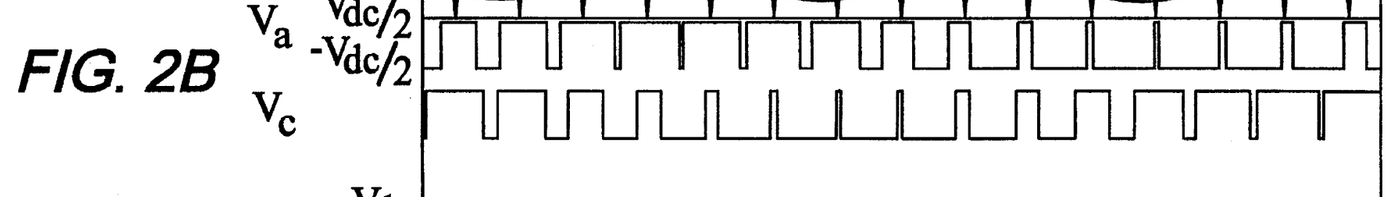
Figure 2C:
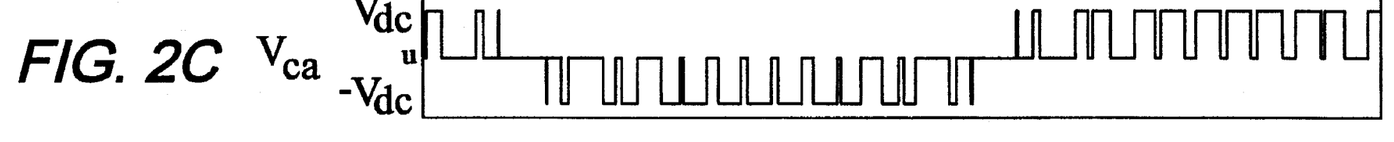

FIGS. 2A–C are graphs illustrating one PWM technique called "sine-coded PWM." As shown in FIG. 2A, a high-frequency triangular carrier wave, $v_{carrier}$, is compared to three modulating input waveforms representing the desired output voltage waveforms $v_a$, $v_b$, and $v_c$. When the modulating waveform is above the carrier waveform, the upper transistor is on, and $v_{dc}/2$ is applied to the output; when the modulating waveform is below the carrier waveform, the lower transistor is on and $-v_{dc}/2$ is applied to the output. The results of this comparison for $v_a$ and $v_b$ are shown in FIG. 2B. FIG. 2C shows the resulting line-to-line voltage $v_{ca}$; this voltage varies between $+v_{dc}$ and $-v_{dc}$.

Figure 3A:
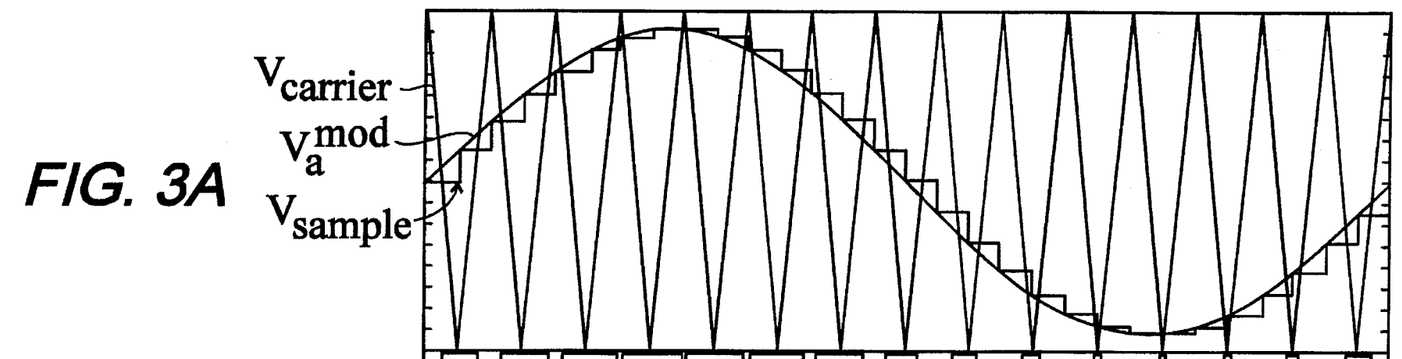
FIG. 3 is a graph showing Sampled, sine-coded pulse width modulation according to the prior art.

The sine-coded PWM control can be performed by a microcontroller. In that case, instead of using a voltage waveform, the triangular carrier waveform is simulated by a counter within the microcontroller. The microcontroller periodically samples each modulating waveform. FIG. 3A is a graph showing sampling of one of the three modulating waveforms at each point that the simulated triangular wave changes direction. This sampling technique produces a step function, the width of each step being equal to one-half of a period of the triangular carrier waveform. As the triangular waveform, $v_{carrier}$, and the sampled waveform, $v_{sample}$, are both linear, it is possible to calculate easily the time at which these waveforms intersect. It is these times that are used to determine when the PWM gating signals are changed.

Figure 3B:
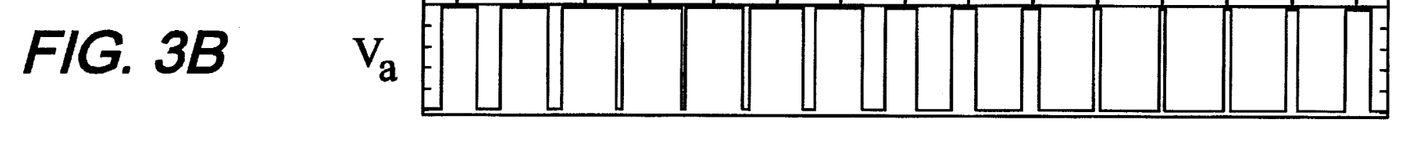

FIG. 3B is a graph showing the pulse output generated by the control circuit in response to the comparison of the waveforms shown in FIG. 3A. In FIG. 3B, the pulse output goes low when the carrier waveform is above the modulating waveform, and goes high when the carrier waveform is bellow the modulating waveform. Because the amplitude of the carrier waveform is greater than that of the modulating waveform, the triangular peaks of the carrier waveform always lie out Bide of the modulating waveform. At each positive peak of the carrier waveform, the pulse output in FIG. 3B goes low. Thus, in the time period from positive peak to positive peak, a single pulse output is created. It will be apparent that the average voltage of the output during this time period is a function of the duty cycle of the pulse output generated by the control circuit. The upper limit of available voltage is defined by the average output voltage when the duty cycle approaches 100 percent, and the lower limit of available voltage is defined by the average output voltage when the duty cycle approaches 0 percent.

However, using the basic sine-coded algorithm, there is a limit to the amplitude of the input modulating waveforms, as the amplitude of the input waveforms approaches that of the carrier waveform. When the modulating waveform extends above the carrier waveform, the pulses near the peak merge together, and a phenomenon known as "pulse-dropping" occurs, as the duty cycle cannot exceed 100 percent. During pulse-dropping, the effective voltage that is produced contains numerous harmonics in addition to the fundamental. This has the dual effect of reducing the ratio of fundamental RMS voltage to modulating waveform RMS as well as increasing distortion of the desired voltage. The maximum line-line voltage beyond which pulse-dropping occurs is given by the following formula:

$$v_{rms}^{max}=0.612*v_{dc}$$

In most applications, rather than the individual phase voltages $v_a$, $v_b$, and $v_c$, the important voltages are the line-to-line voltages $v_{ab}$, $v_{bc}$, and $v_{ca}$. In these applications, it is known in the prior art to increase the amount of line-to-line voltage that can be generated by modifying the modulating waveforms by adding a third harmonic to each phase waveform. The equations for the modified modulating waveforms are as follows:

$$v_a^{mod}=v_p(sin(2\pi ft)+ksin(6\pi ft))$$

$$v_b^{mod}=v_p(sin(2\pi ft-120°)+ksin(6\pi ft))$$

$$v_c^{mod}=v_p(sin(2\pi ft+120°)+ksin(6\pi ft))$$

Figure 4:
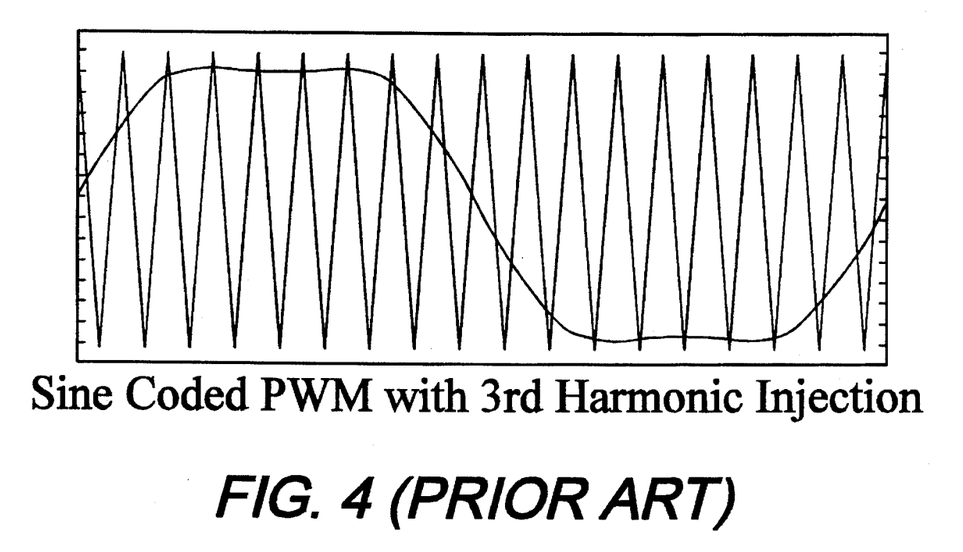
FIG. 4 is a graph showing Sine-coded pulse width modulation with 3rd-harmonic injection, according to the prior art.

Because the same voltage $k \cdot sin(6\pi ft)$ is added to each phase voltage, the line-to-line voltages are unaffected. However, the peaks of the modulating waveforms are reduced as shown in FIG. 4. Now, the amplitude of the fundamental component of the modulating waveform can be higher before pulse dropping occurs. The line-to-line voltage at which pulse dropping occurs with third-harmonic injection is given by the following equation:

$$v_{rms}^{max}=0.707*v_{dc}$$

However, although the injection of the third harmonic term in microcontroller systems increases the amount of line-to-line voltage that can be generated, certain problems arise from the increased complexity of the modulating waveform. In particular, systems that require control of current typically produce modulating waveforms that have only a fundamental component of voltage. This voltage has a zero-crossing point that is load-dependent, so that synchronization of these control outputs to a third harmonic is a difficult process.

To better understand the present invention, it is helpful to view PWM gating signals during one period of the carrier waveform. Assuming that the modulating waveforms have been normalized to one-half the DC bus voltage (i.e., $V_{dc}/2$), and that the carrier wave varies between −1 and 1, FIG. 5 shows an example of the phase voltages for the following sampled values of modulating waveforms:

$$v_a^{mod}=0.5, v_b^{mod}=0, v_c^{mod}=-0.5$$

Figure 5:
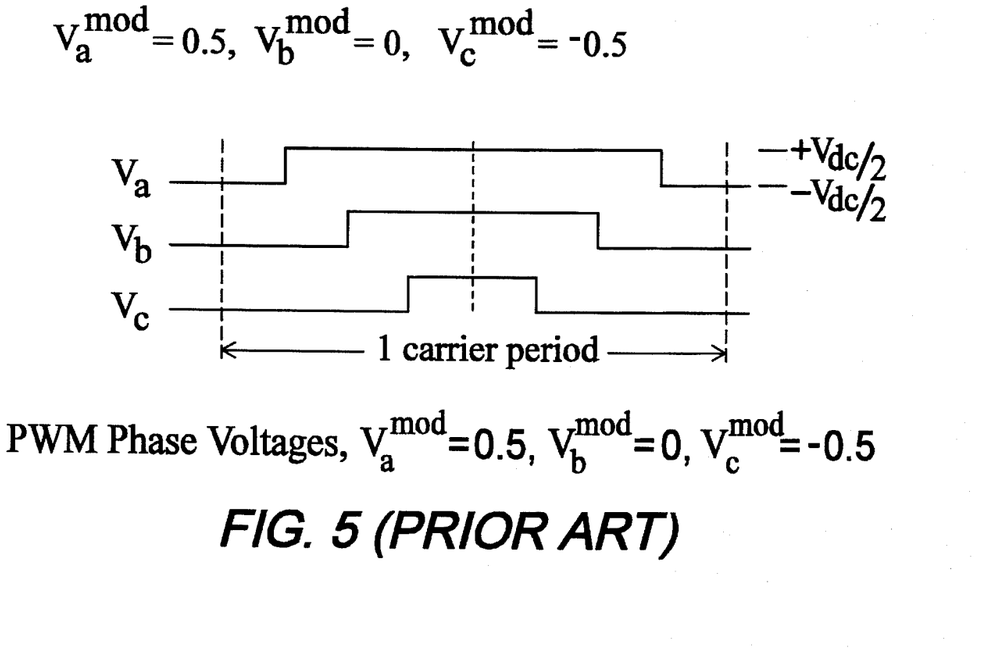
FIG. 5 is a graph showing phase voltages of the output of the pulse width modulation circuit in a single carrier period, according to the prior art.

In FIG. 5, one carrier period is taken to be between two of the positive peaks of the triangular waveform shown in FIG. 3. $V_a$ is high for 75% of the period; its average voltage is thus:

$$v_a ave=(0.75-0.25)(v_{dc}/2)=0.5(v_{dc}/2)$$

Likewise, $$v_b ave=0 \text{ and } v_c ave=-0.5(v_{dc}/2)$$

Without the addition of third harmonics to the modulating waveforms, there is a problem when the peak voltage $v_p$ is greater than 1. For example, assume $v_p=1.2$, then the sampled values of the modulating waveforms at the peak of $v_a$ are given by:

$$v_a^{mod}=+1.2, v_b^{mod}=-0.6, v_c^{mod}=-0.6$$

This situation will result in pulse dropping, as $v_p$ exceeds the amplitude of the triangular carrier waveform. The present invention solves this problem by using a linear combination of the sampled modulating waveforms to produce an effect similar to third-harmonic injection without requiring a phase-locked sine wave of third harmonic to be added.

In a preferred embodiment of the present invention, a single value is subtracted from all of the sampled waveforms that forces the maximum duty cycle to be as close to 100% as the minimum duty cycle is from 0%. This value is the average of the minimum and the maximum of the sampled waveforms.

This principle can be illustrated with reference to the above voltages. The maximum of the three voltages is $V_a^{mod}$, and $v_b^{mod}$ is the minimum; their average is 0.3. Subtracting 0.3 from each of the three sample waveforms yields the following values:

$$v_a^{mod}=+0.9$$

Figure 6:
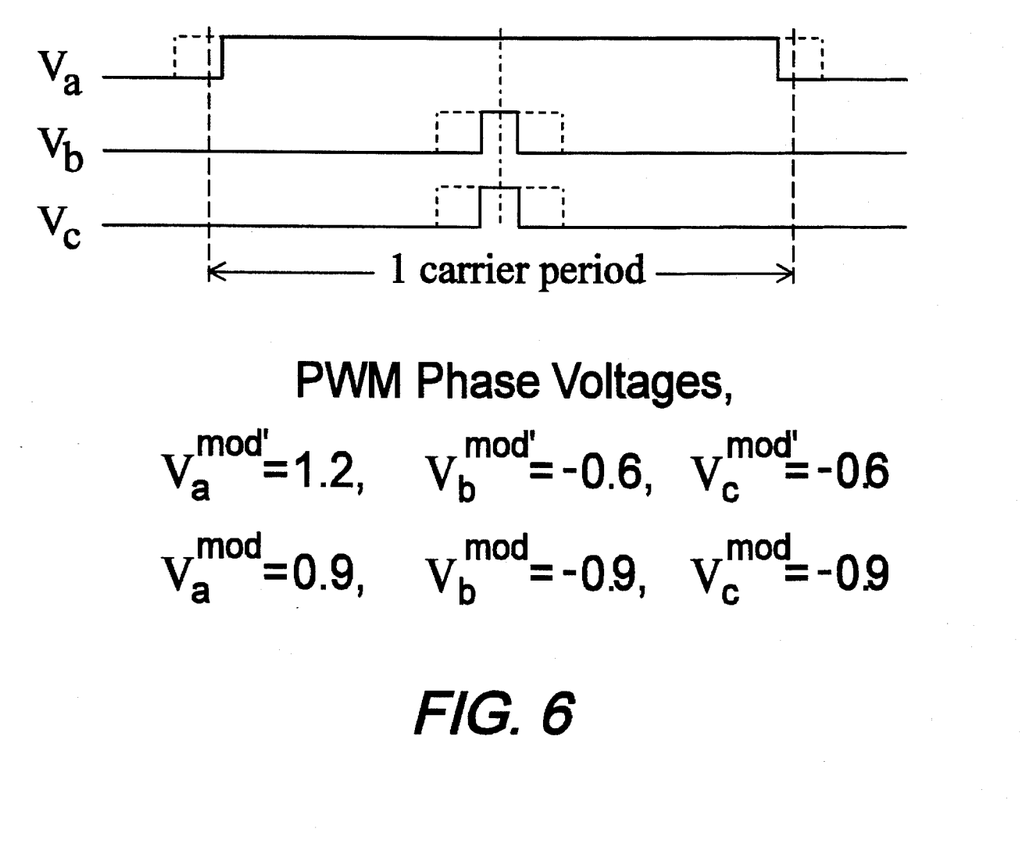
FIG. 6 is a graph showing Shifted phase voltages of the output of the pulse width modulation circuit in single carrier period, according to a preferred embodiment of the present invention.

The resulting phase voltages are shown in FIG. 6. In FIG. 6, the unmodified sample voltages are shown in dotted lines and are unattainable since the edges of $v_a^{mod}$ fall outside of the carrier period start and finish, requiring in effect a duty cycle of greater than 100 percent. However, the modified phase voltages do not cause pulse-dropping and still maintain the required line-to-line voltage relationships.

Figure 7:
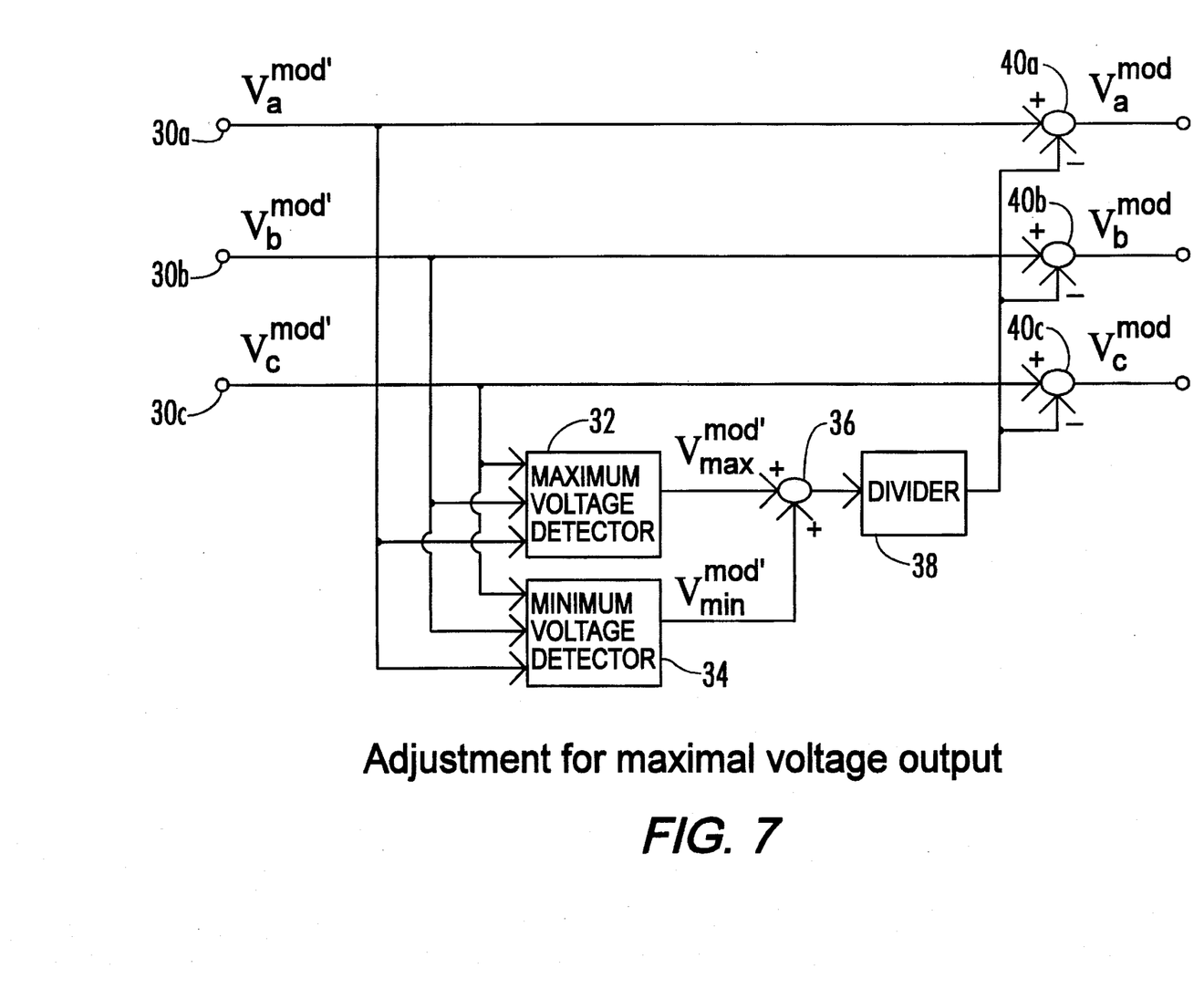
FIG. 7 is a schematic drawing showing a preferred embodiment of the present invention.

A block diagram of a present preferred embodiment of the invention is shown in FIG. 7. Three modulating sinusoidal waveform inputs are provided at terminals 30a–c. The modulating waveforms are sampled periodically. As described above, the sampling can take place at each point that the carrier wave changes direction.

A maximum voltage detector circuit 32 determines which of the three voltages is the greatest. At the same time, a minimum voltage detector circuit 34 determines which of the three voltages is the smallest. The maximum and minimum voltages are then added together in a summing junction 36, and then fed to a divider 38, where the sum of the maximum and minimum voltages is divided by a predetermined averaging factor.

Although, as described above, the invention can be practiced by dividing the summed voltages by two, it has been found that it is desirable to divide the voltages by three. This gives slightly less harmonics when the PWM is saturated (i.e., when pulse dropping occurs), thus "softening" the PWM response in the saturation region.

The voltage resulting from the division is subtracted from the voltages of the three modulating waveforms at three junctions 40a–c. The shifted modulating waveform voltages are then fed to the appropriate hardware needed to determine the relative position of those voltages compared with the triangular carrier wave, in order to turn the appropriate switches on and off.

The present invention may also be implemented in software in a microcontroller, or similar device. Appendices A and B hereto show source code listings for this implementation. Appendix A is a listing of a program that shifts the modulating waveforms in the manner described above. Appendix B is a listing of a subroutine entitled "MaxMinAdj" that is called by the Appendix A program.

While the foregoing description includes detail which will enable those skilled in the art to practice the invention, it should be recognized that the description is illustrative in nature and that many modifications and variations will be apparent to those skilled in the art having the benefit of these teachings. It is accordingly intended that the invention herein be defined solely by the claims appended hereto and that the claims be interpreted as broadly as permitted in light of the prior art.

---

```
State11: Listing A
      CALL MaxMinAdj;   {Find –(VREFmax+VREFmin)/3 = VREFmid/3}
         {Returns AX0=VAref, AX1=VBref, AY0=VCref, MR1=VREFmid/3}
   {-----Shift references by VREFmid/3, normalize to PWM counts and center
         about 25% point in carrier:
         RTIME = Ncnts_over4 – (Vref + VREFmid/3) / Vbus
   ------}
         AY1=Ncnts_over4;         {25% point in carrier}
         SR0=Ncnts_over2;         {50% point in carrier (for overflow)}
         MY0=DM(VBUS_INV);        {Prepare to multiply all refs by this}
         AR=MR1+AY0;              {VCref + VREFmid/3}
         AY0=MR1;                 {Prepare to add to remaining refs}
         MR=AR*MY0 (RND);         {VCcnts= –(3*VCref+3*VREFmid/3) * [63/(3*Vbus)]}
                                  {3*VCref is in units of AtoD counts,2FX0
                                  63/(3*Vbus) is PWMcnts/AtoD counts, 2FX15
                                  result is PWYcnts, 2FX0}
   { Calculate PWM C risetime in counts. If risetime < 0 then it must be clamped
         at 0 (ie. 100% duty cycle). If 0 <= risetime < Ncnts/2 then OK. If
         risetime >= Ncnts/2 then want 0% duty cycle so we set
         risetime = Ncnts. This is a count that will never occur in the PWM
         FPGA so there will be no rising edge of the PWM. }
         AF=MR1–AY1;              {Check for overflow, maximum allowed
                                  MR1 is Ncnts/4 – 1}
         IF GE AF=PASS SR0;       {If GE then want 0% duty, set max counts}
         AR=SR0+AF;               {Shift counts back to around Ncnts/4}
         IF LT AR= PASS 0;        {Clamp underflow if needed}
         DM(RTIME_C)=AR;          {Send C risetime to hardware}
   { Repeat calculations for A phase}
         AR=AX0+AY0;              {VAref + VREFmid/3}
         MR=AR*MY0(RND);          {VAcnts= –(3*VAref+3*VREFmid/3) * [63/(3*Vbus)]}
         AF=MR1–AY1;              {Check for overflow (see above)}
         IF GE AF=PASS SR0;
         AR=SR0+AF;               {Shift counts back (see above)}
         IF LT AR= PASS 0;        {Check for underflow (see above)}
         DM(RTIME_A)=AR;          {Send A risetime to hardware}
   { Repeat calculations for B phase}
         AR=AX1+AY0;              {VBref + VREFmid/3}
         MR=AR*MY0 (RND);         {VBcnts= –(3*VBref+3*VREFmid/3) * [63/(3*Vbus)]}
         AF=MR1–AY1;              {Check for overflow (see above)}
         IF GE AF=PASS SR0;
         AR=SR0+AF;               {Shift counts back (see above)}
         IF LT AR= PASS 0;        {Check for underflow (see above)}
         DM(RTIME_B)=AR;          {Send B risetime to hardware}
         I7=^State0;              {Setup I7 for next state}
   Exit_int:
         ENA SEC_REG;             {Background uses second regs}
         RTI;
   {***************************************************************************}
                                APPENDIX A
   MaxMinAdj: Listing B
   { Find the amount that the references must be shifted to approximate the same
```

-continued

```
    input/output characteristics achieved using third harmonic injection.
The rational for doing this in as follows:
    Since the PWM must only maintain the specified line-line voltages,
    the line to neutral references could be chosen to allow the maximum
    PWM voltage to be attained. This would be done by shifting these line
    to neutral references so that the maximum and minimum are equal
    distance from zero (shifting by [Min+Max]/2); this would maximimize
    the amount of difference between the min and max before saturation
    occurs.
    However, to 'soften' the PWM response in the saturation region the
    references are only shifted by 2/3 this amount: (Min+Max)/3.
Note that it is assumed that VAref+VBref+VCref = 0 so that (Min+Max) = -Mid.
Inputs:
    VA_REF, VB_REF, VC_REF - Line to Neutral voltage references
Outputs:
    AX0=VA_REF
    AX1=VB_REF
    AY0=VC_REF
    MR1=-(VREFmin + VREFmax)/3 = VREFmid/3
TIMING: 14 cycles
}
    AX0=DM(VA_REF);      {Get references and store temporarily}
    AX1=DM(VB_REF);
    AY0=DM(VC_REF);
{------ Find maximum and minimum voltage references -----}
    AR=AX0-AY0;          {Compare Va - Vc}
    IF LT JUMP A_LT_C;
    AF=AX1-AY0;          {Va >= Vc, compare Vb - Vc}
    IF LT JUMP C_MID;
    AF=AR-AF;            {Va >= Vc, Vb >= Vc, compare (Va-Vc) - (Vb-Vc)}
    IF GT JUMP B_MID;
A_MID: AR=PASS AX0;      {Vb >= Va >= Vc if from above or
                          Vc > Va > Vb if from below, get middle ref}
    JUMP GET_ADJ;
C_MID: AR=PASS AY0;      {Va >= Vc > Vb if from above or
                          Vb > Vc > Va if from below, get middle ref}
    JUMP GET_ADJ;
A_LT_C: AF=AX1-AY0;      {Vc > Va, compare Vb - Vc}
    IF GT JUMP C_MID;
    AF=AR-AF;            {Vc > Va, Vc >= Vb, compare (Va-Vc) - (Vb-Vc)}
    IF GT JUMP A_MID;
B_MID:
    AR=PASS AX1;         {Vc > Vb >= Va if from last test or
                          Va > Vb >= Vc if jumped to, get middle ref}
{------ Find -(Vmax+Vmin)/3 = Vmid/3 -------}
GET_ADJ:
    MY0=0x5555;          {Load 1/3, 2FX16Y}
    MR=AR*MY0 (RND);     {MR1 = -(Vmax+Vmin)/3}
    RTS;
                              APPENDIX B
```

What is claimed is:

1. A control circuit form actuating first, second, and third switching means in a three-phase inverter, such that the switching means provide, respectively, first, second, and third outputs that approximate corresponding three-phase input sinusoidal waveforms, the circuit comprising:

pulse width modulation means for receiving the three-phase modulating waveforms as an input and, for each of the three input waveforms, determining the intersection of the input waveform with a high-frequency carrier waveform and switching the switching means associated with the input waveform on or off depending upon whether the input waveform is above or below the carrier waveform, such that the average voltage of the inverter output during a period of the carrier waveform depends upon the duty cycle of the output of the pulse width modulation means within that period, the control circuit further including means for maximizing the line-to-line voltages of the outputs of the pulse width modulation means, the maximizing means including means for determining, at a given time, the maximum voltage of the three waveforms;

means for determining, at the same time, the minimum voltage of the three waveforms;

means for summing the maximum and minimum voltages;

means for dividing the summed voltages by an averaging factor to produce an average voltage;

means for subtracting the average voltage from each of the modulating waveforms, thereby adjusting the voltages of the three waveforms, while preserving the line-to-line relationships among the three waveforms; and means for providing the three adjusted modulating waveforms as an input to the pulse width modulation means.

2. A control circuit according to claim 1, wherein the averaging factor is 2.

3. A control circuit according to claim 1, wherein the averaging factor is 3.

4. A method for actuating first, second, and third switching means in a three-phase inverter, such that the switching means provide, respectively, first, second, and third outputs that approximate corresponding three-phase input sinusoidal waveforms, the method comprising:

providing pulse width modulation means for receiving the three-phase modulating waveforms as an input and, for each of the three input waveforms, determining the intersection of the input waveform with a high-frequency carrier waveform and switching the switching means associated with the input waveform on or off depending upon whether the input waveform is above or below the carrier waveform, such that the average voltage of the inverter output during a period of the carrier waveform depends upon the duty cycle of the output of the pulse width modulation means within that period, maximizing the line-to-lit Le voltages of the outputs of the pulse width modulation means by determining, at a given time, the maximum voltage of the three waveforms;

determining, at the same time, the minimum voltage of the three waveforms;

summing the maximum and minimum voltages; dividing the summed voltages by an averaging factor to produce an average voltage;

subtracting the average voltage from each of the modulating waveforms, thereby adjusting the voltages of the three waveforms, while preserving the line-to-line relationships among the three waveforms; and providing the three adjusted modulating waveforms as an input to the pulse width modulation means.

5. A method according to claim 4, wherein the averaging factor is 2.

6. A method according to claim 4, wherein the averaging factor is 3.

* * * * *